(12) United States Patent  (10) Patent No.: US 8,043,550 B2
Chang et al.  (45) Date of Patent: Oct. 25, 2011

(54) MANUFACTURING METHOD OF DISPLAY DEVICE AND MOLD THEREFOR

(75) Inventors: Jae-hyuk Chang, Gyeonggi-do (KR); Mun-pyo Hong, Gyeonggi-do (KR); Nam-seok Roh, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 789 days.

(21) Appl. No.: 11/592,062

(22) Filed: Nov. 2, 2006

(65) Prior Publication Data

US 2007/0099323 A1 May 3, 2007

(30) Foreign Application Priority Data

Nov. 2, 2005 (KR) .................. 10-2005-0104511

(51) Int. Cl.
*B29C 59/16* (2006.01)

(52) U.S. Cl. ........ 264/446; 264/227; 264/255; 264/319; 264/483; 264/494

(58) Field of Classification Search .................. 264/483, 264/494, 219, 250, 255, 446, 447, 226, 227, 264/319, 463, 299; 216/24, 67, 52, 54
See application file for complete search history.

(56) References Cited

U.S. PATENT DOCUMENTS

| | | | | |
|---|---|---|---|---|
| 5,952,129 A * | 9/1999 | Kiguchi et al. | .................... | 430/7 |
| 6,063,527 A * | 5/2000 | Nishikawa et al. | ................ | 430/7 |
| 6,304,384 B1 * | 10/2001 | Nishikawa | ..................... | 359/619 |
| 6,632,700 B1 * | 10/2003 | Fan et al. | ........................ | 438/70 |
| 6,814,897 B2 | 11/2004 | Morita | | |
| 2004/0038138 A1 * | 2/2004 | Kiguchi et al. | .................... | 430/7 |
| 2005/0121782 A1 | 6/2005 | Nakamura et al. | | |
| 2005/0122567 A1 * | 6/2005 | Otake et al. | .................... | 359/299 |
| 2005/0158637 A1 * | 7/2005 | Kim et al. | .......................... | 430/5 |

FOREIGN PATENT DOCUMENTS

| | | |
|---|---|---|
| CN | 1038525 | 1/1990 |
| CN | 1359532 | 7/2002 |
| JP | 2003-272998 | 9/2003 |
| JP | 2004-160647 | 6/2004 |
| JP | 2004-221465 | 8/2004 |
| JP | 2004-304097 | 10/2004 |

(Continued)

OTHER PUBLICATIONS

English Language Abstract, KR Patent First Publication No. 1020050075066, Jul. 20, 2005, 1 page.

(Continued)

*Primary Examiner* — Yogendra Gupta
*Assistant Examiner* — Ninh Le
(74) *Attorney, Agent, or Firm* — Innovation Counsel LLP

(57) ABSTRACT

A method of manufacturing a display device in which a film deposited on a substrate through openings in a covering layer is easily removed from the covering layer, is described herein, includes forming a master layer having a predetermined pattern of openings on a base substrate; spraying a light shielding material on the master layer; fabricating a mold provided with the light shielding film by forming a moldable material layer on the base substrate and the master layer; the moldable material layer and the light shielding material; arranging, pressurizing, and exposing the mold on an insulation substrate having a photosensitive film formed thereon after separating the mold from the master layer; and developing the photosensitive film after separating the mold from the insulation substrate.

14 Claims, 19 Drawing Sheets

FOREIGN PATENT DOCUMENTS

| | | |
|---|---|---|
| JP | 2004-351693 | 12/2004 |
| JP | 2005-197669 | 7/2005 |
| JP | 2006-013453 | 12/2006 |
| KR | 10-2004-0012439 A | 2/2004 |
| KR | 1020040088977 | 10/2004 |
| KR | 10-2005-0035134 A | 4/2005 |
| KR | 10-2005-0067249 A | 7/2005 |
| KR | 10-2005-0075580 A | 7/2005 |
| KR | 10-2005-0075581 A | 7/2005 |
| KR | 1020050067244 | 7/2005 |
| KR | 1020050075066 | 7/2005 |
| KR | 10-2005-0079037 A | 8/2005 |
| TW | 573142 | 1/2004 |
| TW | I220066 | 8/2004 |
| TW | I234036 | 6/2005 |
| TW | I235176 | 7/2005 |
| TW | I236559 | 7/2005 |
| TW | I 239297 | 9/2005 |
| WO | 03/031096 A2 | 4/2003 |

OTHER PUBLICATIONS

English Language Abstract, KR Patent First Publication No. 1020050067244, Jul. 1, 2005, 1 page.

English Language Abstract, KR Patent First Publication No. 1020040088977, Oct. 20, 2004, 1 page.

* cited by examiner

MANUFACTURING METHOD OF DISPLAY DEVICE AND MOLD THEREFOR

CROSS-REFERENCE TO RELATED APPLICATIONS

This application claims priority from Korean Patent Application No. 2005-0104511, filed on Nov. 2, 2005, in the Korean Intellectual Property Office, the disclosure of which is incorporated herein by reference.

FIELD OF INVENTION

The present invention relates to manufacturing of a display device and, more particularly, to molding portions of the display.

DESCRIPTION OF THE RELATED ART

In general, a liquid crystal display comprises a liquid crystal panel including a thin film transistor (TFT) substrate where a TFT is formed, a color filter substrate having a color filter and a liquid crystal layer interposed therebetween. Since the liquid crystal panel does not itself emit light, a backlight unit is positioned at the rear of the TFT substrate.

The TFT substrate and the color filter substrate each includes a plurality of layers formed in a predetermined pattern conventionally formed using photolithography. However, sometimes the reproducibility of the pattern is not good and the photo etching process equipment is expensive.

Recently, an imprint lithography method has been used to form a pattern on a layer. The imprint lithography method uses a mold and inexpensive equipment in a simple process. However, when a pattern is formed by a mold, an undesirable residual film may remain due.

SUMMARY OF THE INVENTION

In the process of applying light shielding material to the substrate of a display device having a color filter layer, the light shielding material is sprayed onto the color filter pattern having openings that reveal the substrate. It is desired that the light shielding material enter into and cover the substrate through the openings but thereafter be easily removable from the solid portions of the color filter. In accordance with the invention, the surface of the substrate accessible through the openings is treated so that the difference between the interface tensions of the substrate layer and the sprayed on light shielding material is smaller than the interface tensions between the color filter layer and the sprayed on light shielding material. Accordingly, it is an aspect of the present invention to provide a manufacturing method of a display device which is capable of effectively removing a residual film remaining on a substrate after a molding process that comprises: providing a base substrate; forming a master layer provided with an opening of a predetermined pattern for exposing at least a portion of the base substrate; jetting a light shielding material inside the opening after treating a surface of the base substrate exposed through the opening of the master layer and increasing the difference in interface tensions between the master layer and the light shielding material through the surface treatment; fabricating a mold provided with a light shielding film by forming a moldable material layer on the base substrate and the master layer and then curing the moldable material layer and the light shielding material; arranging, pressurizing and exposing the mold on an insulation substrate having a photosensitive film formed thereon after separating the mold from the master layer; and developing the photosensitive film after separating the mold from the insulation substrate.

According to an aspect of the present invention, the base substrate includes silicon oxide. According to an aspect of the present invention, the base substrate includes a base layer and an inorganic layer formed on the base layer, and the inorganic layer includes silicon nitride. According to an aspect of the present invention, the surface treatment includes a $CF_4$ plasma treatment. According to an aspect of the present invention, the interface tension of the master layer becomes small through the $CF_4$ plasma treatment so that the master layer has a strong hydrophobic property. According to an aspect of the present invention, the surface treatment includes an $O_2/CF_4$ plasma treatment and a self-assembly monolayer (SAM) treatment. According to an aspect of the present invention, the master layer includes one of PC411B and PC405G.

According to an aspect of the present invention, the pattern forming layer includes PDMS (Polydimethylsilixane).

The foregoing and/or other aspects of the present invention can be achieved by providing a mold comprising: a supporting layer; a pattern forming layer which is formed on a first surface of the supporting layer and has at least one projection; and a light shielding film which is formed on a second surface of the supporting layer and located in a region corresponding to the projection.

According to an aspect of the present invention, the supporting layer includes at least one of PET (Polyethylene Terephthalate) and PC (Polycarbonate). According to an aspect of the present invention, each of the pattern forming layer and the supporting layer is made of a transparent material through which ultraviolet light is transmitted, and the light shielding film is made of a material for shielding ultraviolet light.

According to an aspect of the present invention, the mold further comprises a buffer layer positioned between the supporting layer and the light shielding film.

BRIEF DESCRIPTION OF THE DRAWINGS

The foregoing and other aspects and advantages of the prevent invention will become apparent from a reading of the ensuing description together with the drawing, in which:

FIGS. 3A to 3L sequentially illustrate a manufacturing method of a display device according to the first embodiment of the present invention;

DETAILED DESCRIPTION

Figure 1:
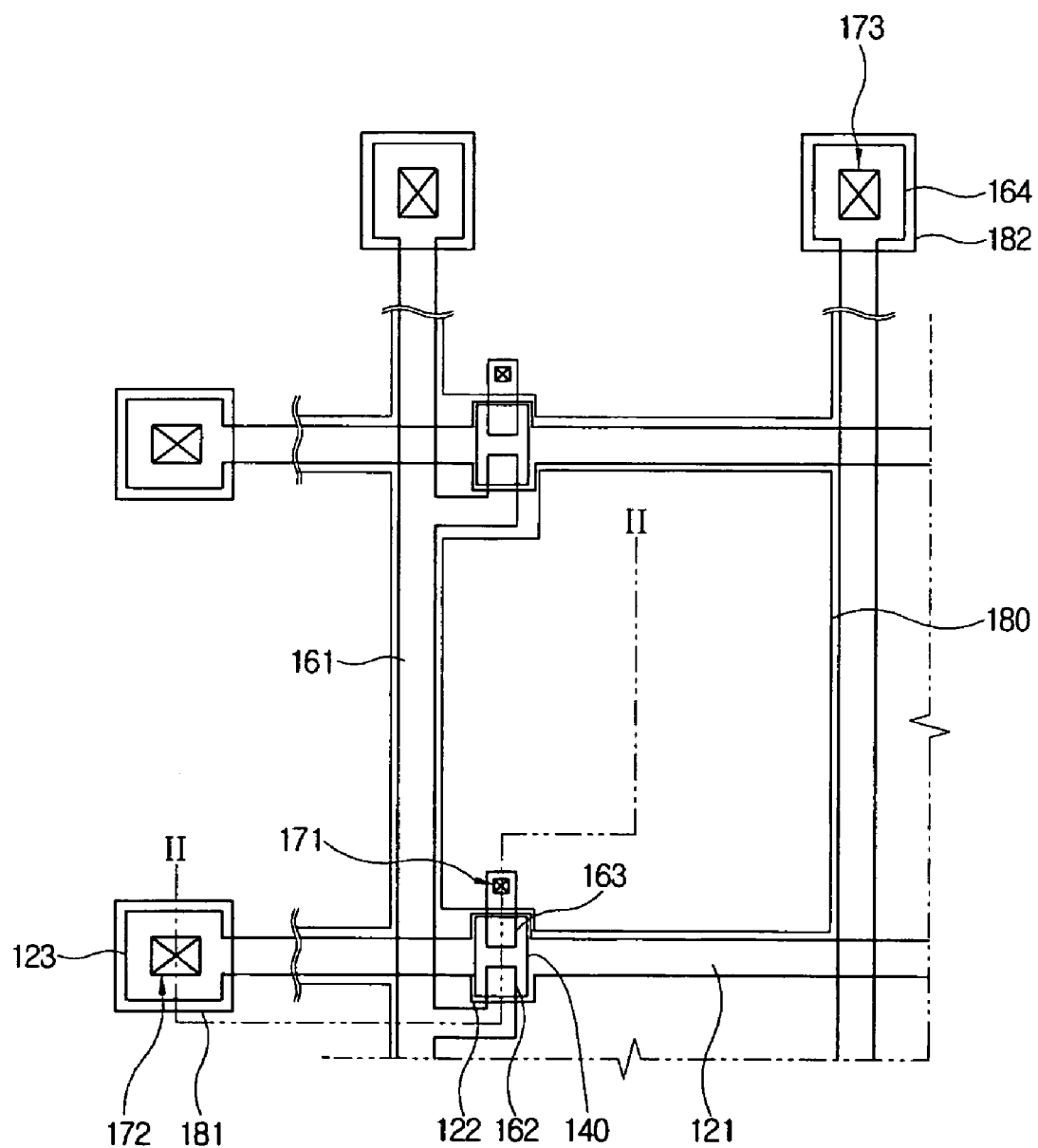
FIG. 1 illustrates a thin film transistor substrate according to a first embodiment of the present invention.

Reference will now be made in detail to the embodiments of the present invention, examples of which are illustrated in the accompanying drawings, wherein like reference numerals refer to like elements throughout. The embodiments are described below so as to explain the present invention by referring to the figures. It will be understood that if a film (layer) is formed (located) "on" another film (layer), this means not only a case where two films (layers) are in contact with each other but also a case where another film (layer) is interposed between two films (layers). Further, it will be apparent that although a liquid crystal display is described below the invention is also applicable for other flat panel displays such as OLEDs and PDPs.

Figure 2:
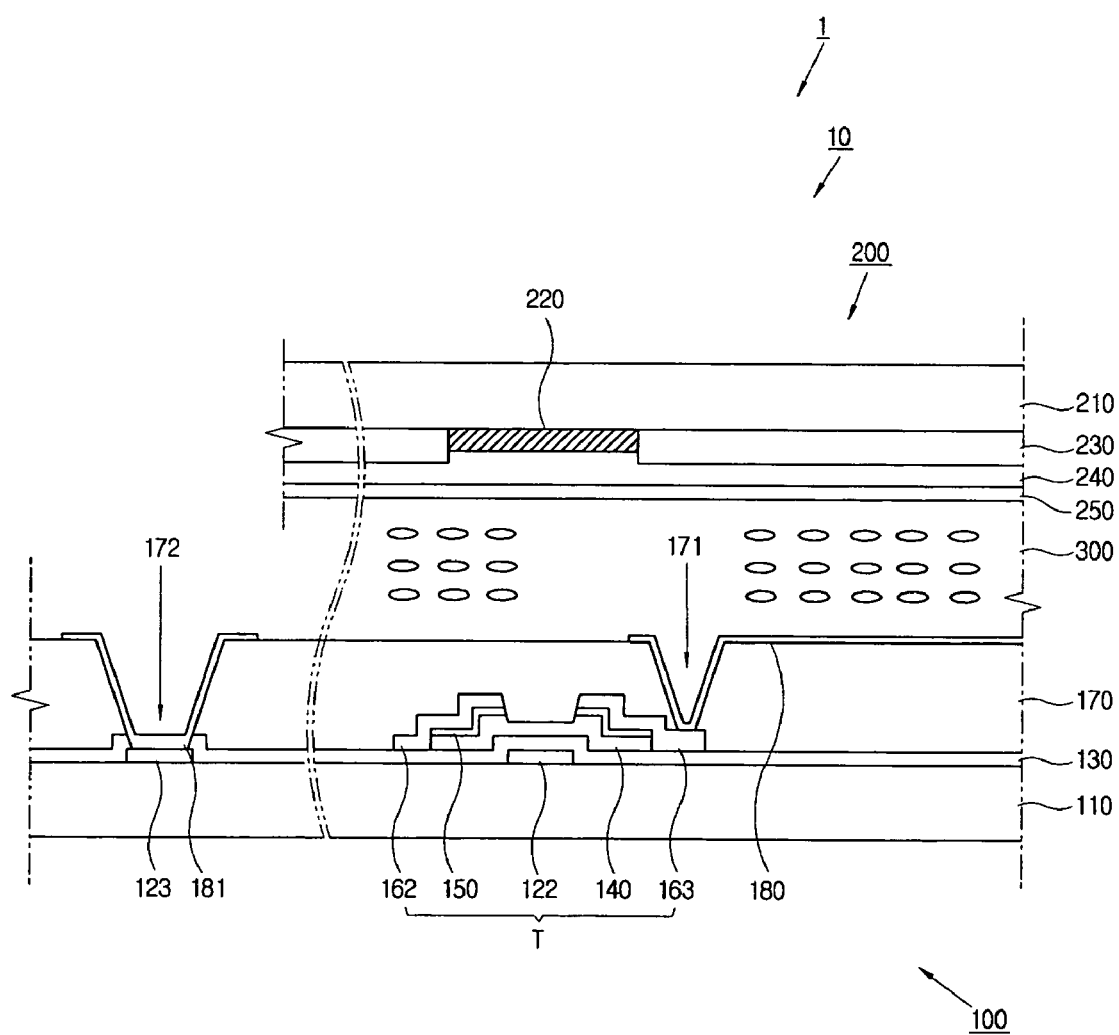
FIG. 2 is a cross-sectional view of a display device taken along line II-II in FIG. 1.

FIG. 1 illustrates a thin film transistor (TFT) substrate according to a first embodiment of the present invention, and FIG. 2 is a cross-sectional view taken along line II-II in FIG. 1.

A liquid crystal display (LCD) 1 according to the first embodiment of the present invention comprises a liquid crystal panel 10 including a thin film transistor substrate 100 (hereinafter, referred to as a "first substrate") provided with a thin film transistor (TFT), which is a switching or driving device for respectively controlling or driving an operation of each pixel; a color filter substrate 200 (hereinafter, referred to as a "second substrate") attached to substrate 100 and a liquid crystal layer 300 interposed between substrates 100 and 200.

Substrate 100 comprises a first insulation substrate 110; gate conductors 121, 122 and 123, data conductors 161, 162, 163 and 164; a TFT T formed at an intersection of the gate and data conductors; and a pixel electrode 180 connected to the TFT T. A signal voltage is applied between pixel electrode 180 and a common electrode 250 of the color filter substrate 200 through the TFT T aligning the molecules of the liquid crystal layer 300 and varying its the light transmissivity.

Substrate 110 may comprises an insulation material such as glass, quartz, ceramic or plastic when manufacturing a flexible LCD is preferred. Suitable materials for manufacturing a plastic substrate include polycarbonate, polyimide, PNB (polynorbornen) PES, PAR, PEN (polyethylenapthanate) or PET (polyethylene terephthalate) or the like.

Gate conductors 121, 122 and 123 are formed on substrate 110 and may each be a single metal layer or have multiple metal layers. Gate conductors 121, 122 and 123 comprises a gate line 121 extending transversely, a gate electrode 122 connected to gate line 121 and a gate pad 123 located at an end of gate line 121 and which is connected to a gate driver (not shown) to receive a driving signal. Gate insulation film 130, made of silicon nitride (SiNx) or the like, covers gate conductor 121, 122 and 123.

Semiconductor layer 140, made of a semiconductor such as amorphous silicon, is formed on gate insulation film 130 over gate electrode 122. An ohmic contact layer 150 made of n+ hydrogenated amorphous silicon which is highly doped with silicide or n-type impurities is formed on semiconductor layer 140. Ohmic contact layer 150 is removed in a channel portion between the source and drain electrodes 162 and 163.

Data conductors 161, 162, 163 and 164 are formed on ohmic contact layer 150 and gate insulation film 130. Data conductors 161, 162, 163 and 164 may each also be formed of single or multiple metal layers. Data conductors 161, 161, 163 and 164 comprise a data line 161 extending longitudinally, crossing gate line 121 to form a pixel. Source electrode 162 branches from data line 161 and extends over ohmic contact layer 150. Drain electrode 163 is spaced apart from source electrode 162 and is formed on ohmic contact layer 150 opposite source electrode 162, Data pad 164 which is located at an end of the gate line 161.

Passivation film 170 is formed on data conductors 161, 161, 163 and 164 and on the portion of semiconductor layer 140 which is not covered with the data conductors. On passivation film 170 are formed a drain contact hole 171 for exposing the drain electrode 163 and a gate pad and a data pad contact holes 172 and 173 for respectively connecting the gate driver (not shown) and the data driver (not shown) so as to apply a driving signal to the gate and data lines 121 and 161. In order to improve the efficiency of the TFT T, an inorganic insulation film comprising silicon nitride may be further formed between passivation film 170 and TFT T.

Pixel electrode 180 is formed on passivation film 170. In general, pixel electrode 180 is made of a transparent conductive material such as ITO (Indium Tin Oxide) or IZO (Indium Zinc Oxide). Pixel electrode 180 is electrically connected to the drain electrode 163 through the drain contact hole 171. Further, auxiliary contact members 181 and 182 are formed on gate pad and data pad contact holes 172 and 173. In general, auxiliary contact members 181 and 182 are also made of a transparent conductive material such as ITO (Indium Tin Oxide) or IZO (Indium Zinc Oxide).

Color filter substrate 200 will be described below.

Black matrix 220 is formed on second insulation substrate 210. Black matrix 220 appears in spaces between red, green and blue filters and prevents light from being radiated to the TFT T. Black matrix 220 is advantageously made of a photosensitive organic material having a black pigment such as carbon black, titanium oxide or the like.

Red, green and blue filters are formed on color filter 230 each having black matrix 220 as a boundary. Color filter 230 endows light radiated from the backlight unit (not shown) passing through the liquid crystal layer 300 with color. In general, the color filter 230 is made of a photosensitive organic material.

An overcoat layer 240 is formed on color filter 230 and black matrix 220. Overcoat layer 240 functions to protect color filter 230 while planarizing the color filter. In general, acryl-based epoxy is frequently used as the material of overcoat layer 240.

On overcoat layer 240 is formed common electrode 250. Common electrode 250 is made of a transparent conductive material such as ITO (Indium Tin Oxide) or IZO (Indium Zinc Oxide). Common electrode 250 together with pixel electrode 180 apply a voltage to the liquid crystal layer 300 of substrate 100.

Liquid crystal layer 300 is injected between substrates 100 and 200 which are joined by a sealant so that the liquid crystal panel 10 is completely contained.

An imprint lithography method of manufacturing an LCD according to an embodiment of the present invention will be described below in which the fabrication of the second substrate is illustrated in FIGS. 3a to 3l. However, it will be apparent that the invention is intended to be applied to pattern formation of other layers.

Figure 3A:
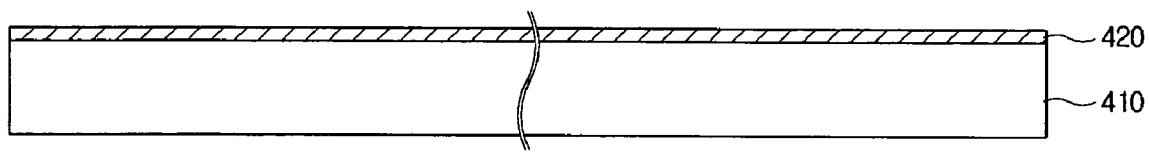

As shown in FIG. 3a, a base substrate having a lower base layer 410 and an upper inorganic layer 420 in which base layer 410 may include glass, plastic or the like. Layer 420 is an inorganic material layer comprising silicon nitride whose surface is treated so that it provides an interface tension that is close to the interface tension of light shielding material 440. Inorganic layer 420 may be formed on the base layer 410 using CVD (Chemical Vapor Deposition) or the like. Alternatively, the base substrate may be formed in a single layer comprised of silicon oxide. It is preferred that the single-layered base substrate also have its surface treated to provide an interface tension close to that of light shielding material 440.

Figure 3B:
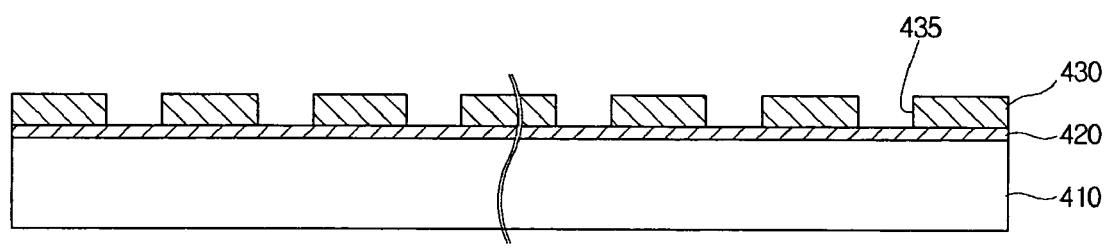

Next, as shown in FIG. 3b, a master layer 430 with an opening 435 of a predetermined pattern for exposing at least a portion of the inorganic layer 420 is formed on the base substrate 420. Master layer 430 is a mold form for manufacturing a mold 460 (FIG. 3H). Master layer 430 comprises a photosensitive organic material and a thermal or photo curing agent. The process for fabricating master layer 430 is as follows. First, a photosensitive organic material is applied in a predetermined thickness on layer 420. The photosensitive organic material is exposed while a mask having an opening of a predetermined pattern is arranged thereover. Then, the photosensitive organic material is developed, thereby forming the master layer 430 having openings 435 of the predetermined pattern. Either a photosensitive organic material which is removed after being exposed through a mask can be used (in which event the opening pattern of the mask corresponds to the openings 435). Alternatively, a material which remains where exposed through the mask can be used in which case the opening pattern 435 corresponds to the regions not exposed by the mask. The size and location of the opening 435 formed on the master layer 430 are formed to correspond to those of the black matrix 220, respectively. This is for the purpose of fabricating the mold 460 to remove a residual film of color filter 230 which remains on black matrix 220, and because color filter 230 used in this embodiment comprises the photosensitive organic material of which region not to be exposed is removed. Meanwhile, although not shown in this figure, it will be apparent that the imprint lithography method of the present invention can be also be used for fabricating master layer 430.

Figure 3C:
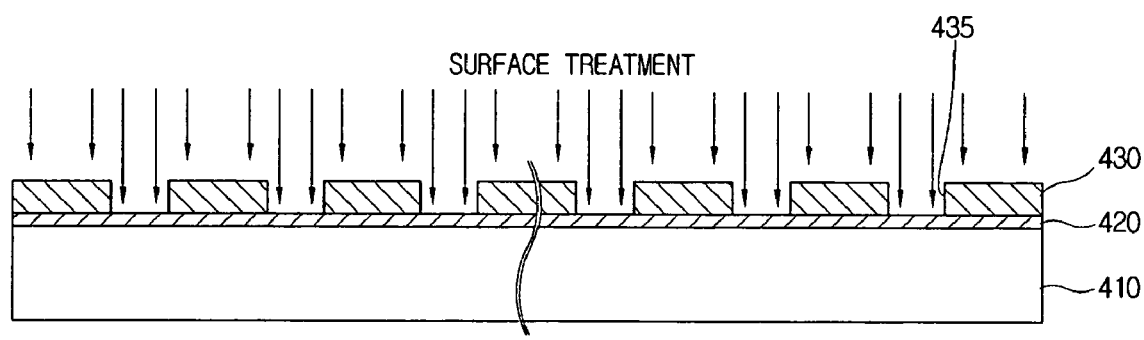
Figure 4:
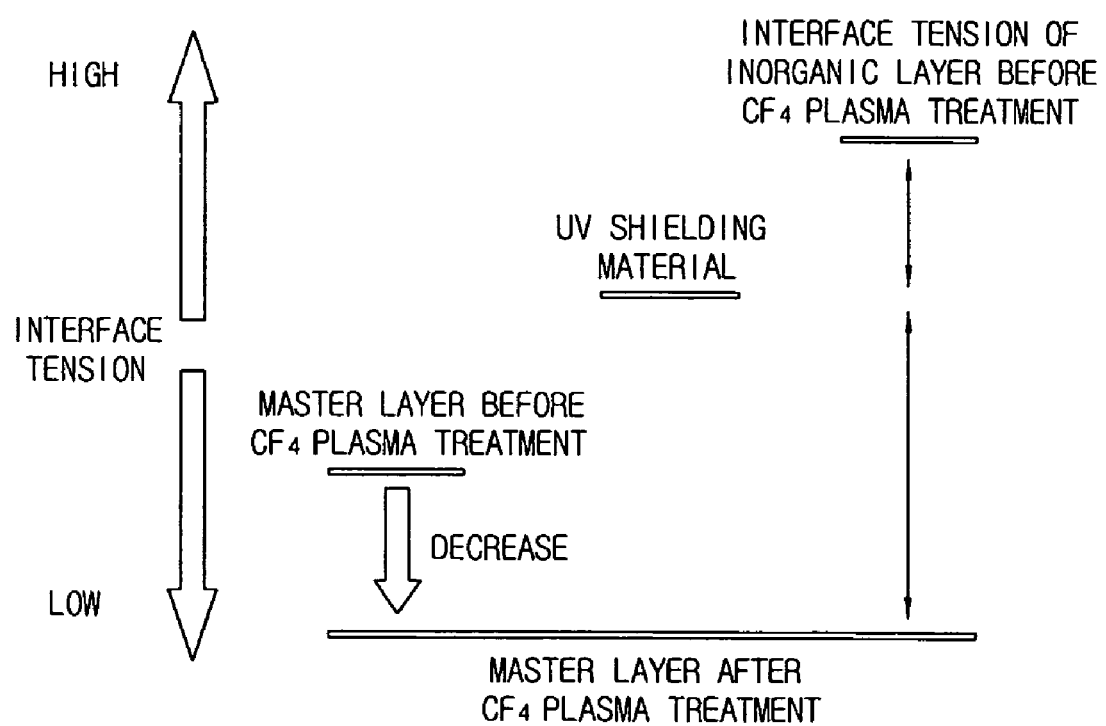
FIGS. 4 and 5 illustrate the operation and effect of surface treatment according to the first embodiment of the present invention.
Figure 5:
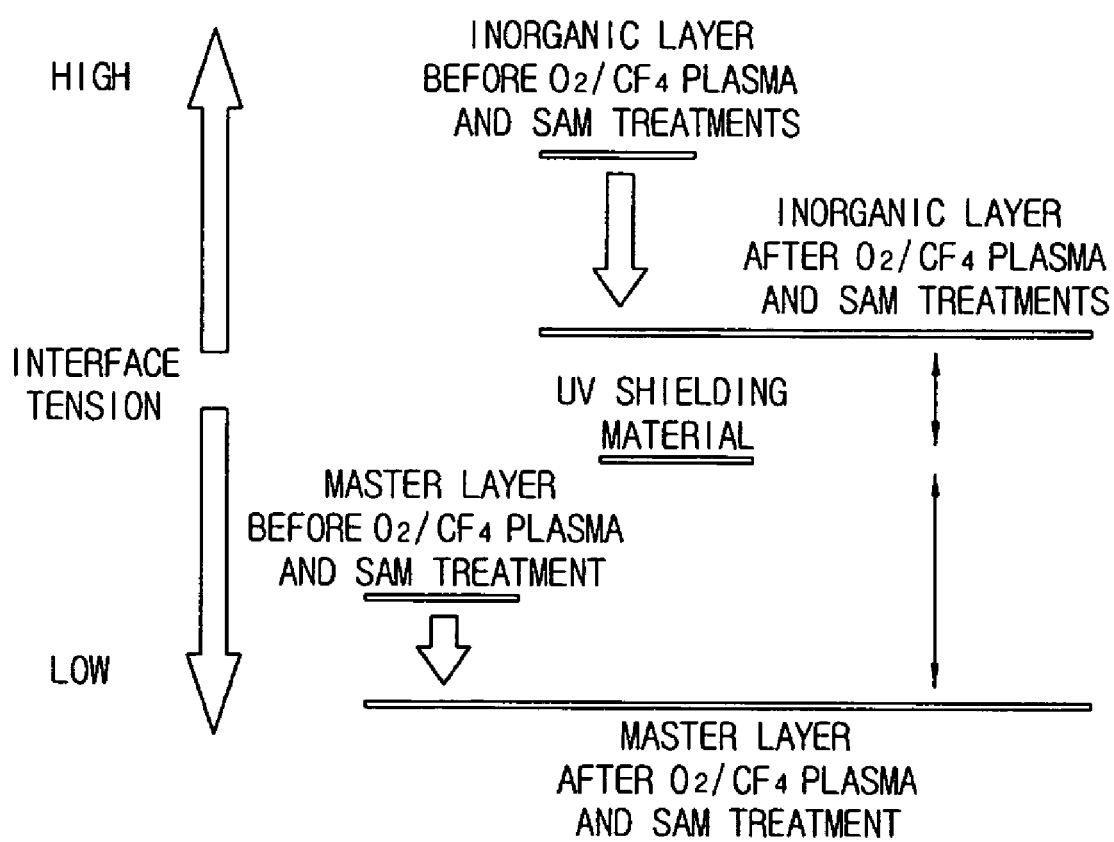

Subsequently, as shown in FIG. 3c, surfaces of layer 420 exposed by the opening 435 and of master layer 430 are treated to change a property of the master layer 430 so as to increase the difference between the interface tensions of master layer 430 and light shielding material 440. That is, the surface treatment causes the difference between the interface tensions of layer 420 and light shielding material 440 to become smaller than the interface tensions between master layer 430 and light shielding material 440. Accordingly, light shielding material 440 jetted onto master layer 430 can be gathered inside the opening 435. Here, the surface treatment may include a $CF_4$ plasma treatment. Through the $CF_4$ plasma treatment, the interface tension of master layer 430 becomes small so that its property changes to a strong hydrophobic property. Accordingly, as shown in FIG. 4, the level of the interface tension of the master layer 430 becomes low so that its gap with the level of the interface tension of the light shielding material 440 becomes large, and the difference of the interface tensions between the inorganic layer 420 and the light shielding material 440 relatively becomes small. In another embodiment, the surface treatment may include an $O_2/CF_4$ plasma treatment and a self-assembly monolayer (SAM) treatment. As shown in FIG. 5, the decrease in interface tension of inorganic layer 420 becomes larger than that of the interface tension of master layer 430 through the $O_2/CF_4$ plasma treatment and the SAM treatment. That is, the properties of the inorganic layer 420 and the master layer 430 change so that the level of the interface tension of the inorganic layer 420 becomes close to that of the interface tension of the light shielding material 440 through the $O_2/CF_4$ plasma treatment and the SAM treatment.

Figure 3D:
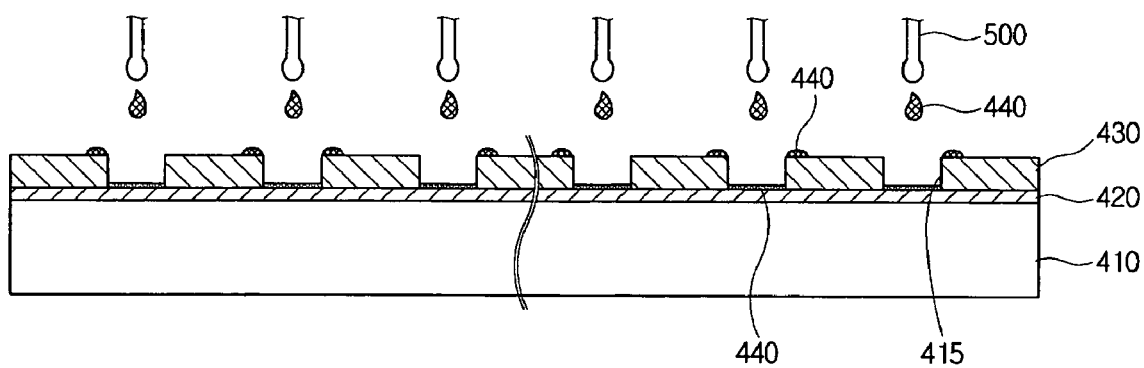

Next, as shown in FIG. 3d, the light shielding material is supplied (sprayed or jetted) inside the opening 435 using a nozzle 500. However, since the size of the opening 435 is small, it is difficult to control the spraying location and the sprayed amount. As a result, the light shielding material 440 jetted from the nozzle 500 may not be precisely loaded inside openings 435. That is, the light shielding material 440 may be located on the master layer 430 as shown in FIG. 3d. If the light shielding material 440 is located on the master layer 430, there is a problem in that the region of the color filter 230 which is required in the pattern forming process is obscured. That is, the color filter 230 is not formed in the desired pattern and picture quality is affected.

Figure 3E:
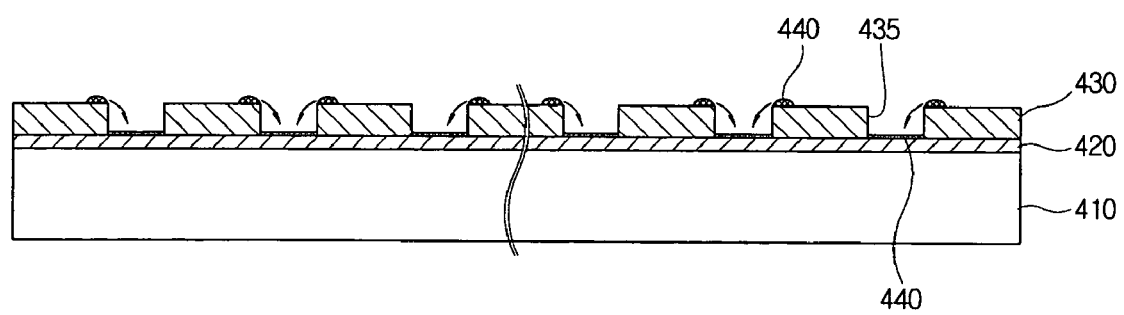

However, if the aforementioned surface treatment is executed, as shown in FIG. 3e, the light shielding material 440 located on the master layer 430 flows in the opening 435 so that the color filter 230 can be formed in the desired pattern. That is, a gap of the interface tensions between the master layer 430 and the light shielding material 440 becomes large through the $CF_4$ plasma or $O_2/CF_4$ plasma treatment and the SAM treatment, and the light shielding material 440 located on the master layer 430 flows in the opening 435 due to the gap of the interface tensions.

Figure 3F:
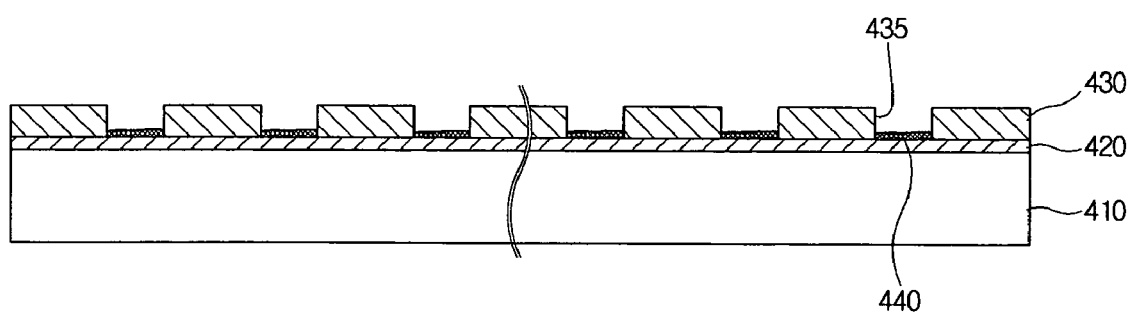

Then, as shown in FIG. 3f, all the light shielding material 440 is gathered inside the opening 435, and the light shielding material 440 does not exist on the master layer 430.

Figure 3G:
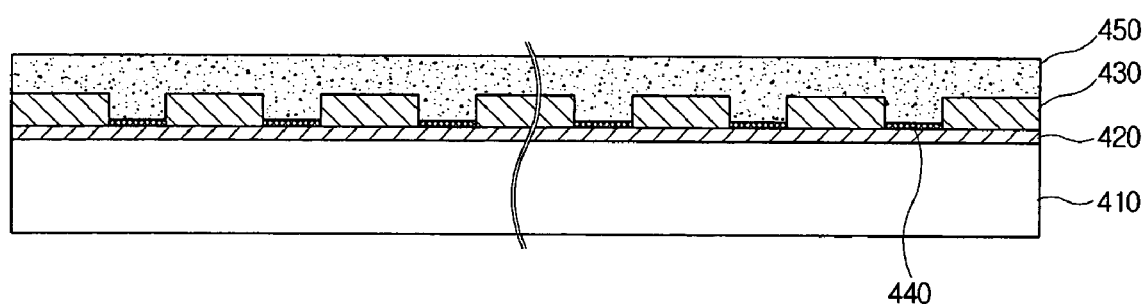
Figure 3H:
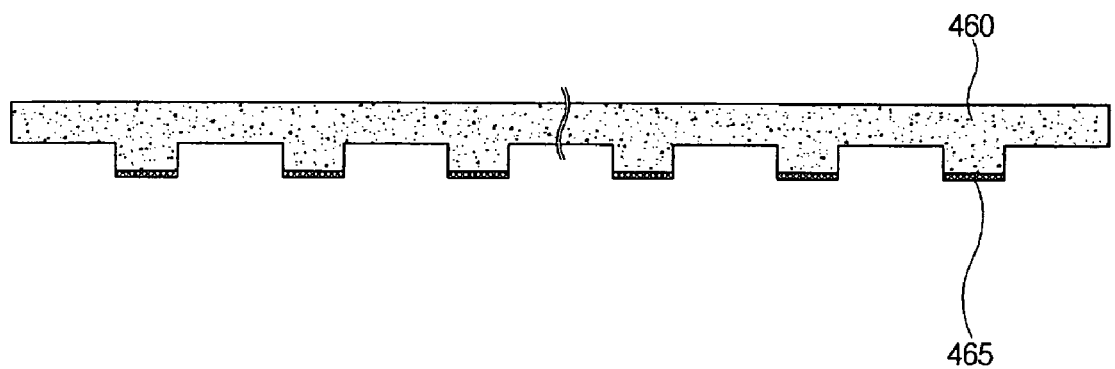
Figure 31:
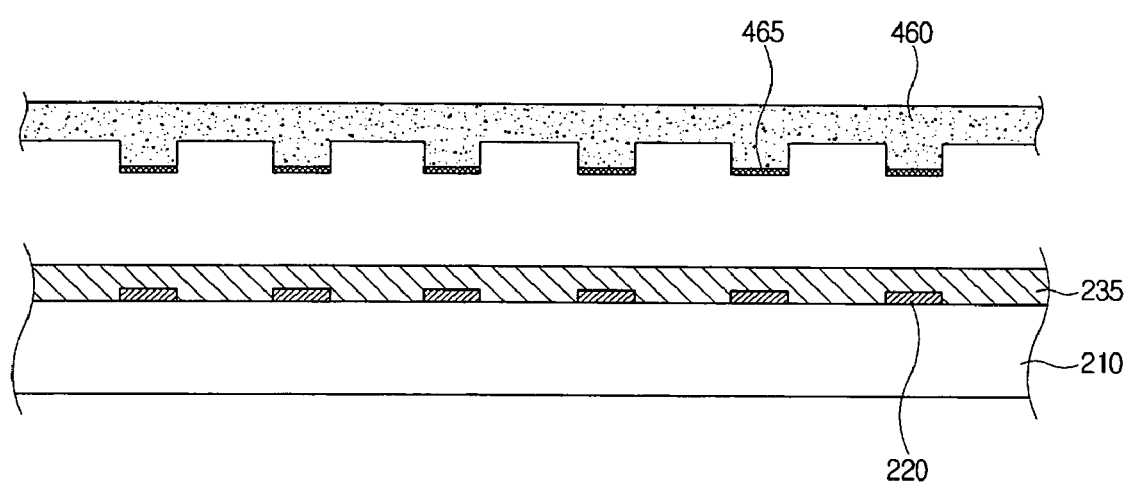

Next, as shown in FIG. 3g, a moldable material layer 450 is formed on the master layer 430 and the opening 435. The moldable material layer 450 comprises an organic material and is cured by heat or light. Further, the moldable material layer 450 is made of a material through which ultraviolet light is transmitted. The moldable material layer 450 may be formed through a coating or screen printing method. When the moldable material layer 450 is formed, the moldable material layer 450 and the light shielding material 440 are cured by light or heat. In the curing process, the moldable material layer 450 and the light shielding material 440 are adhered to each other. Meanwhile, in order to easily separate the mold 460 from the master layer 430 and the opening 435, a mold releasing body is applied to the master layer 430 and the opening 435 so that the moldable material layer 450 may be formed.

After curing the moldable material layer 450 and the light shielding material 440, the moldable material layer 450 and the light shielding material 440 are separated from the master layer 430 and the opening 435. Thus, the mold 460 having the light shielding film 465 formed thereon is manufactured as shown in FIG. 3h.

A method of forming a pattern using the mold 460 having the light shielding film 465 thereon will be described below with reference to FIGS. 3i to 3l. A process of forming the color filter 230 will now be described as an example.

First, a second insulation substrate 210 having a black matrix 220 and a color filter layer 235 formed thereon is provided as shown in FIG. 3i. The black matrix 220 is patterned in a predetermined pattern on the second insulation substrate 210, and the color filter layer 235 is formed on the second insulation substrate 210 and covers the black matrix 220. The black matrix 220 comprises a photosensitive organic material and is formed in the predetermined pattern through an exposing and a developing processes using a mask. On the contrary, it will be apparent that the black matrix 220 may be formed using the mold 460 according to the present invention. The color filter layer 235 comprises a photosensitive organic material and is one of red, green and blue. Although the color filter layer 235 comprising the photosensitive material, of which a portion not radiated by ultraviolet light is removed, is used in this embodiment, a case contrary thereto is also possible. Further, as shown in FIG. 3i, the mold 460 provided through the aforementioned method is aligned and arranged on the second insulation substrate 210 provided with the color filter layer 235. The mold 460 is aligned and arranged so that the light shielding film 465 corresponds to the black matrix 220.

Figure 3J:
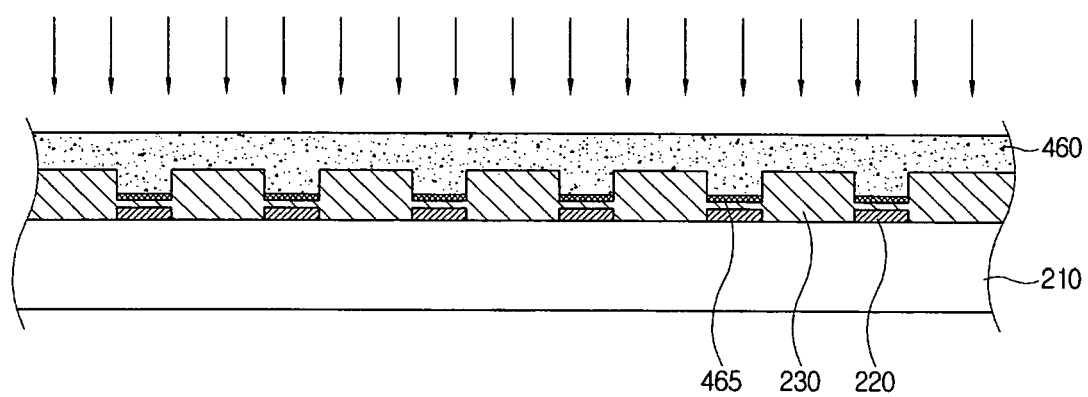

Subsequently, in order to form the color filter layer 235 in a predetermined pattern as shown in FIG. 3j, the mold 460 with a shape corresponding to the predetermined pattern is pressurized in a direction of the second insulation substrate 210. However, the color filter layer 235 on the black matrix 220 is not completely removed and is pressurized in a case where a residual film remains because of a soft property of the mold 460. If there exists such a residual film, degradation of picture quality may be generated. As a result, there is required an additional process for removing the residual film. Thus, in the present invention, a pressurizing process is performed using the mold 460 provided with the light shielding film 465 in a region corresponding to the black matrix 220 so as to remove the residual film of the color filter layer 235 to remain on the black matrix 220, and an exposing process is performed in the pressurized state as shown in FIG. 3j. By the light shielding film 465, the color filter layer 235 located on the black matrix 220 is not exposed, and only the color filter layer 235 located in a region between the black matrixes 220 is exposed.

Figure 3K:
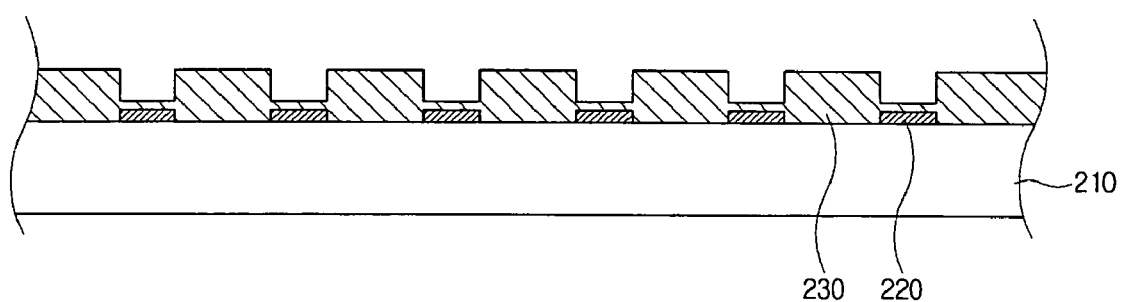

Then, when the mold 460 is separated from the color filter layer 235, the color filter layer 235 is patterned a residual film remaining as shown in FIG. 3k.

Figure 3L:
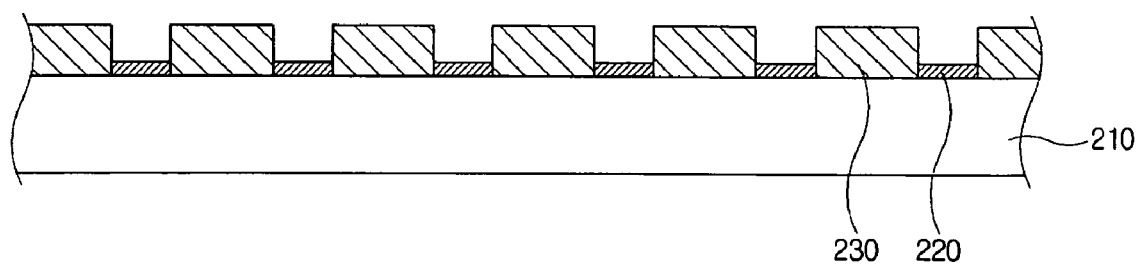

Subsequently, when a developing process is performed as shown in FIG. 3l, the residual film of the color filter layer 235 is removed on the black matrix 220 so that the color filter 230 with a desired pattern is completed.

Then, although not shown in this figure, overcoat layer 240 and the common electrode 250 are formed on the color filter 230 and the black matrix 220 through a known method so that the second substrate 200 is completed.

Figure 6:
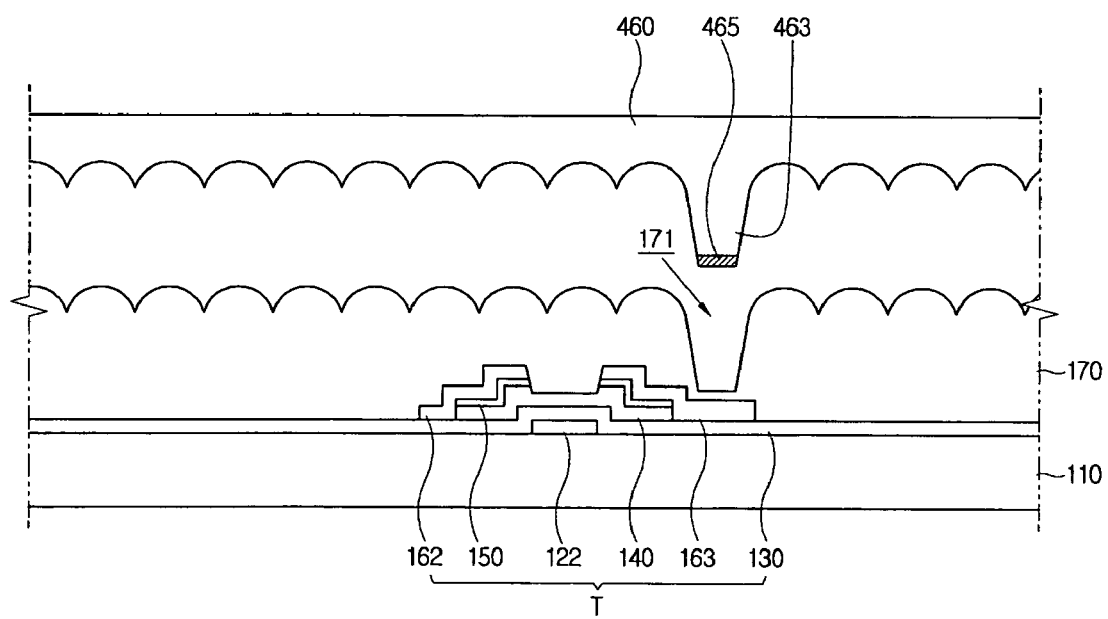
FIG. 6 illustrates a manufacturing method of a display device according to a second embodiment of the present invention.

A manufacturing method of an LCD according to a second embodiment of the present invention will be described below with reference to FIG. 6. FIG. 6 illustrates a method of forming a drain contact hole 171 on the passivation film 170 for connecting a drain electrode 163 to a pixel electrode 180 in a manufacturing method of substrate 100. FIG. 6 shows that a mold 460 is molded on the passivation film 170 and then separated therefrom. In the second embodiment of the present invention, an embossing pattern should be formed on the passivation film 170 so as to manufacture a reflective or transflective LCD. To this end, the mold 460 having a concavo-convex pattern corresponding to the embossing pattern is aligned and arranged on the passivation film 170, and then pressurizes the passivation film 170 so as to form the embossing pattern thereon. At the same time, the drain contact hole 171 for exposing the drain electrode 163 is formed using a projection 463 formed on the mold 460. However, the drain contact hole 171 is not completely formed, and a residual film remains on the bottom thereof so that contact failure may be generated because of a property in that the material of the mold 460 is soft.

Thus, in the present invention, a light shielding film 465 is formed on an end of the projection 463 through the aforementioned method in forming the mold 460 provided with the concavo-convex pattern and the projection 463. After molding and exposing are executed using the mold having the light shielding film 465 formed thereon, a developing process is performed so that the drain contact hole 171 in which the residual film is completely removed is formed.

Meanwhile, although not shown in this figure, it will be apparent that such a method can be applied to the formation of the gate and data pad contact holes 172 and 173.

Figure 7:
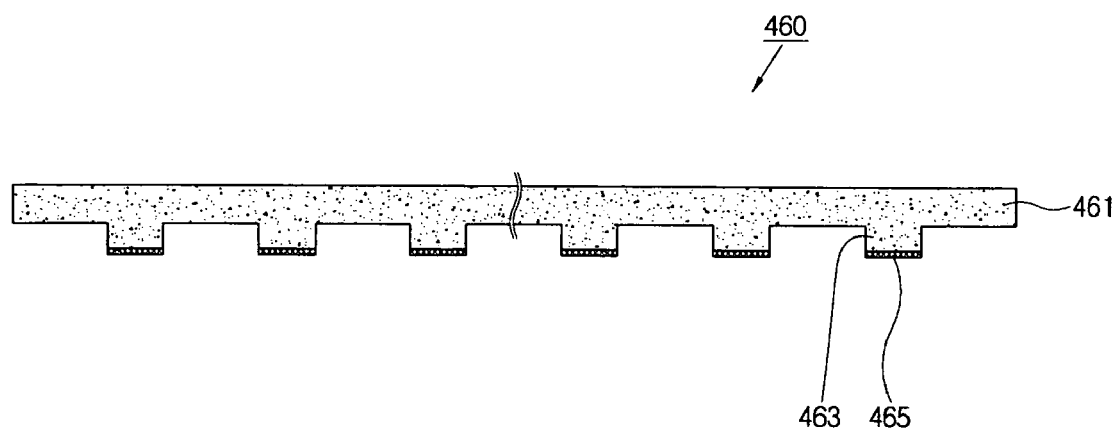
FIG. 7 illustrates a mold manufactured according to the first embodiment of the present invention.

A mold fabricated through the aforementioned method will be briefly described below with reference to FIG. 7.

The mold 460 fabricated through the aforementioned method comprises a pattern forming layer 461 with at least one projection 463 and a light shielding film 465 provided on the end of the projection 463. Preferably, the pattern forming layer 461 is made of a transparent material through which ultraviolet light can be transmitted, and the light shielding film 465 is made of a material for shielding ultraviolet light so as to remove a residual film remaining after an exposing and a developing processes. The pattern forming layer 461 may include PDMS (Polydimethylsilixane).

Figure 8:
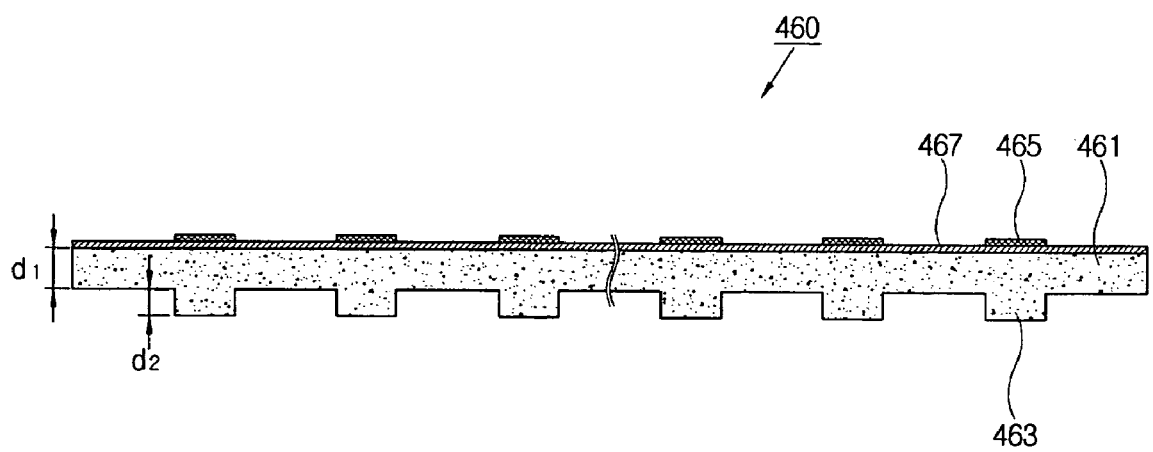
FIG. 8 illustrates a mold according to a third embodiment of the present invention.

A mold according to a third embodiment of the present invention will be briefly described below with reference to FIG. 8. The mold according to the third embodiment comprises a supporting layer 467; a pattern forming layer 461 which is formed on one surface of the supporting layer 467 and has at least one projection 463; and a light shielding film 465 which is formed on the other surface of the supporting layer 467 and located in a region corresponding to the projection 463. Here, the supporting layer 467 may include at least any one of PET (Polyethylene terephthalate) and PC (Polycarbonate). Further, it is preferred that each of the pattern forming layer 461 and the supporting layer 467 be made of a transparent material through which ultraviolet light can be transmitted, and the light shielding film 465 be made of a material for shielding ultraviolet light so as to remove a residual film remaining after an exposing and a developing processes. Here, the mold may further comprise a buffer layer (not shown) located between the supporting layer 467 and the light shielding film 465. In another exemplary embodiment, a mold may further comprise a buffer layer (not shown) covering the light shielding film 465. At this time, the buffer layer (not shown) operates as follows. Since, the pattern forming layer 461 and the supporting layer 467 are made of different materials from each other, they have different thermal expansion coefficients. Thus, the shape of the mold 460 may be deformed when molding them over a predetermined temperature. As a result, the buffer layer (not shown) with the same thermal expansion coefficient as the pattern forming layer 461 is provided on the other surface of the supporting layer 467 so that the deformation of the mold 460 can be minimized. It is preferred that the pattern forming layer 461 and the buffer layer (not shown) be made of the same material so as to have the thermal expansion coefficient practically. Further, it is preferred that the thickness $d_1$ of the pattern forming layer 461 be thicker than that $d_2$ of the projection 463 so as to maintain the entire shape of the mold 460 and to support the projection 463. However, if the thickness $d_1$ of the pattern forming layer 461 is thick when the light shielding film 465 is located on the other surface of the pattern forming layer 461, ultraviolet light passing through the pattern forming layer 461 is refracted and may be radiated to an undesired direction. Thus, the thickness $d_1$ of the pattern forming layer 461 is preferably formed as thin as possible.

As described above, according to the present invention, there is provided a manufacturing method of a display device wherein a residual film remaining on a substrate after molding can be effectively removed and a mold therefor.

Although a few exemplary embodiments of the present invention have been shown and described, it will be appreciated by those skilled in the art that changes will be apparent to those skilled in the art and may be made without, however, departing from the spirit and scope of the invention.

What is claimed is:

1. A manufacturing method of a display device, the method comprising:
    providing a base substrate;
    forming on the substrate a master layer provided with a predetermined pattern of openings exposing portions of the base substrate;

treating the surfaces of the master layer and the base substrate exposed through the opening of the master layer with a reagent; and supplying a first material inside the openings to form a first material layer, the reagent surface treatment causing the difference of interface tensions between the master layer and the supplied first material to be larger than the interface tension between the supplied first material and the substrate, and a top surface of the first material layer is lower than a top surface of the master layer;

fabricating a mold provided with a light shielding film by forming a moldable material layer on the base substrate and the master layer and then curing the moldable material layer and the light shielding material;

arranging, pressurizing, and exposing the mold on an insulation substrate having a photosensitive film formed thereon after separating the mold from the master layer; and developing the photosensitive film after separating the mold from the insulation substrate, wherein the first material is a light shielding material.

2. The method according to claim 1, wherein the base substrate includes silicon oxide.

3. The method according to claim 1, wherein the base substrate includes a base layer and an inorganic layer formed on the base layer, and the inorganic layer includes silicon nitride.

4. The method according to claim 1, wherein the surface treatment includes a $CF_4$ plasma treatment.

5. The method according to claim 4, wherein the interface tension of the master layer becomes small through the $CF_4$ plasma treatment so that the master layer has a strong hydrophobic property.

6. The method according to claim 1, wherein the surface treatment includes an $O_2/CF_4$ plasma treatment and a self-assembly monolayer (SAM) treatment.

7. The method according to claim 6, wherein a decrement of the interface tension of the base substrate is larger than that of the interface tension of the master layer through the O2/CF4 plasma treatment and the SAM treatment.

8. The method according to claim 6, wherein the level of the interface tension of the base substrate becomes close to that of the interface tension of the light shielding material through the surface treatment.

9. The method according to claim 1, wherein the light shielding material supplied onto the master layer flows in the opening through the surface treatment when being supplied.

10. The method according to claim 9, wherein the light shielding material is cured by at least one of heat and light.

11. The method according to claim 1, wherein the moldable material layer is cured by at least one of heat and light.

12. The method according to claim 11, wherein the moldable material layer is made of a material through which ultraviolet light is transmitted.

13. The method according to claim 1, wherein the master layer includes a photosensitive organic material, and is exposed using a mask provided with a predetermined opening pattern and then developed to have the opening formed therein.

14. The method according to claim 1, wherein the photosensitive film includes an organic material.

* * * * *